United States Patent [19]

Li

[11] Patent Number: 5,166,482

[45] Date of Patent: Nov. 24, 1992

[54] DETACHABLE TOUCH-CONTROL LAMP SWITCH

[76] Inventor: Chao Y. Li, No. 54, Lane 1, Sec. 2, Ta Kuan Rd., Pan Chiao City, Taipei Hsien, Taiwan

[21] Appl. No.: 699,125

[22] Filed: May 13, 1991

[51] Int. Cl.$^5$ .................... H01H 35/00; H03K 17/94
[52] U.S. Cl. .................... 200/52 R; 200/600
[58] Field of Search .............. 200/52 R, 51 R, 600, 200/293; 307/116, 114; 361/288

[56] References Cited

U.S. PATENT DOCUMENTS

| | | | |
|---|---|---|---|
| 2,896,131 | 7/1959 | Schumann | 200/600 X |
| 4,237,386 | 12/1980 | Instance | 307/116 |
| 4,293,745 | 10/1981 | Matsuda et al. | 200/52 R |

Primary Examiner—J. R. Scott
Attorney, Agent, or Firm—Lowe, Price, LeBlanc & Becker

[57] ABSTRACT

A detachable touch-control lamp switch, comprising an outer shell, a touch-control metal panel covered over the outer shell, a control circuit board fastened inside the outer shell to receive touch-control signal from the touch-control metal panel, and a socket fastened in the outer shell with the plug holes thereof exposed to the outside for connecting any of a variety of ornamental lamps through an appliance plug. Touching of the hand on the touch-control metal panel causes the control circuit board to send a signal to the connected ornamental lamp through the socket and the plug, so as to drive the connected ornamental lamp to turn on/off or to change the intensity of the light that the connected ornamental lamp produces.

1 Claim, 4 Drawing Sheets

DETACHABLE TOUCH-CONTROL LAMP SWITCH

BACKGROUND OF THE INVENTION

The present invention relates to lamp switches and relates more particularly to a touch control lamp switch which can be conveniently attached to a lamp through a plug to control it to give light and regulate the light it produces.

Regular ornamental lamps which are controlled to operate through touch-control are generally comprised of a conductive outer shell which is simultaneously used as a touch-control panel for touch control. By touching the conductive outer shell, an ornamental lamp is turned on/off or the light intensity is changed. This touch-control structure is not suitable for some ornamental lamps which have a plastic or ceramic outer shell because the plastic or ceramic outer shell is not conductive. Some people tried to mix iron powder in clay for making a conductive, ceramic outer shell. However, this method for making a conductive outershell is not practical due to expensive manufacturing cost.

SUMMARY OF THE INVENTION

The present invention has been accomplished under the circumstances in view. It is therefore the main object of the present invention to provide a detachable touch-control lamp switch which can be attached to any of a variety of ornamental lamps to control an ornamental lamp to give light or change the intensity of light that the connected ornamental lamp produces.

According to the present invention, there is provided a detachable touch-control lamp switch, comprising an outer shell, a touch-control metal panel covered over said outer shell, a control circuit board fastened inside said outer shell to receive touch-control signal from said touch-control metal panel, and a socket fastened in said outer shell with the plug holes thereof exposed to the outside for connecting any of a variety of ornamental lamps through an appliance plug. Touching of the hand on the touch-control metal panel causes the control circuit board to send a signal to the connected ornamental lamp through the socket and the plug, so as to drive the connected ornamental lamp to turn on/off or to change the intensity of the light that the connected ornamental lamp produces.

DETAILED DESCRIPTION OF THE PREFERRED EMBODIMENT

Figure 1:
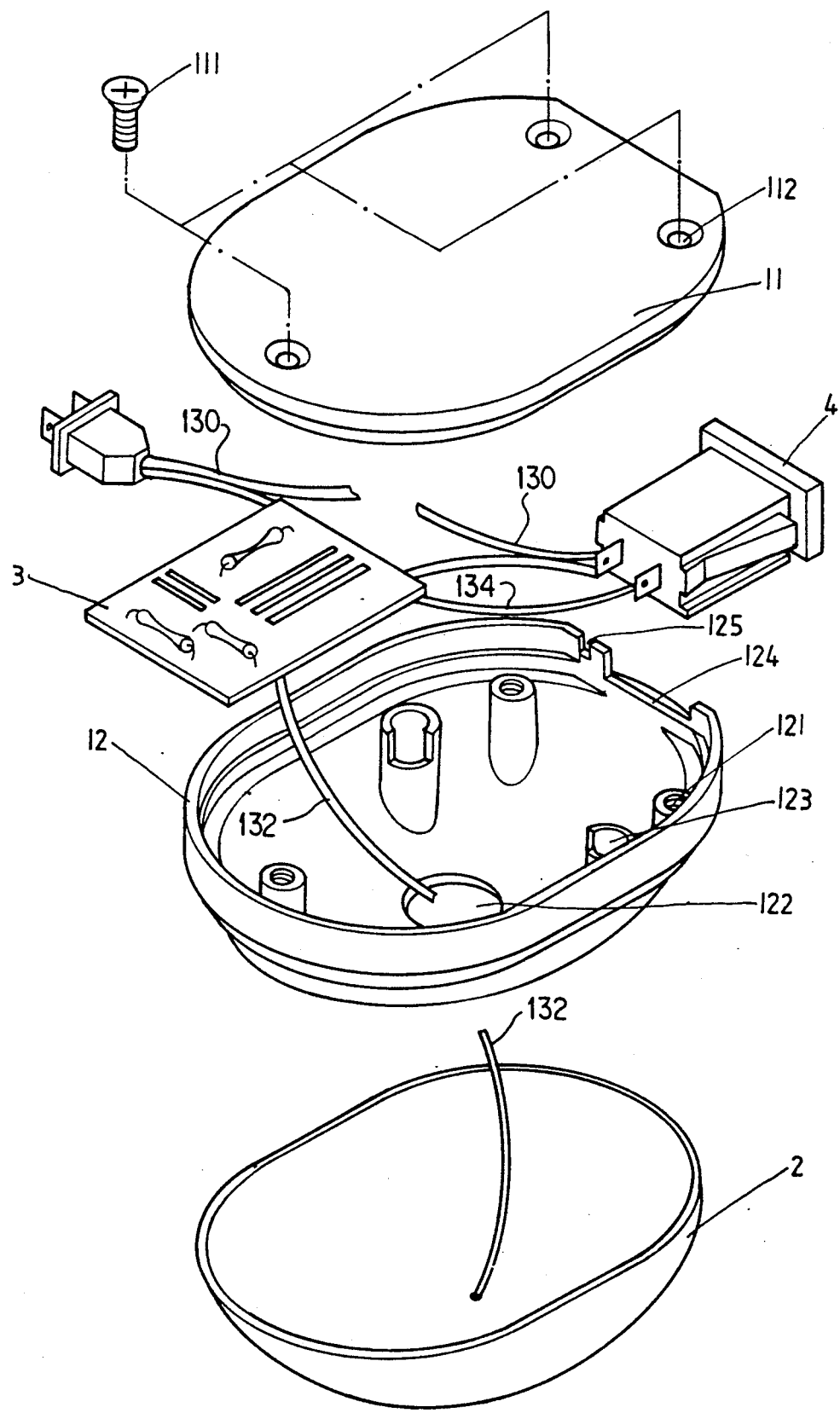
FIG. 1 is a dismantled perspective view of the preferred embodiment of the detachable touch-control lamp switch of the present invention.
Figure 2:
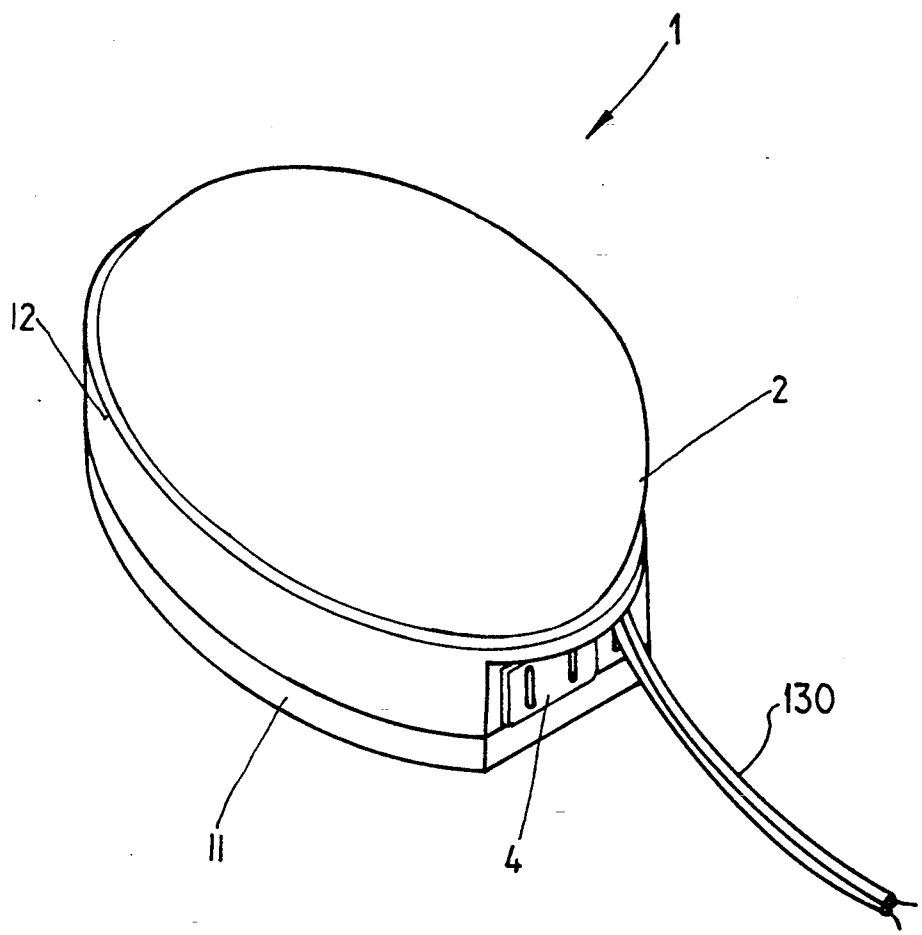
FIG. 2 illustrates the outer appearance of the preferred embodiment of the detachable touch-control lamp switch of the present invention.
Figure 3:
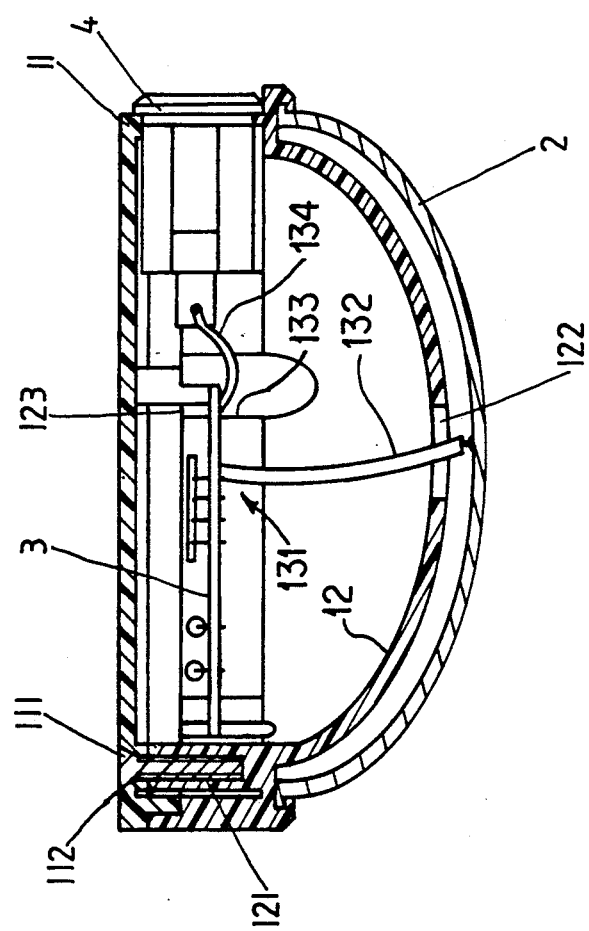
FIG. 3 is sectional assembly view thereof.
Figure 4:
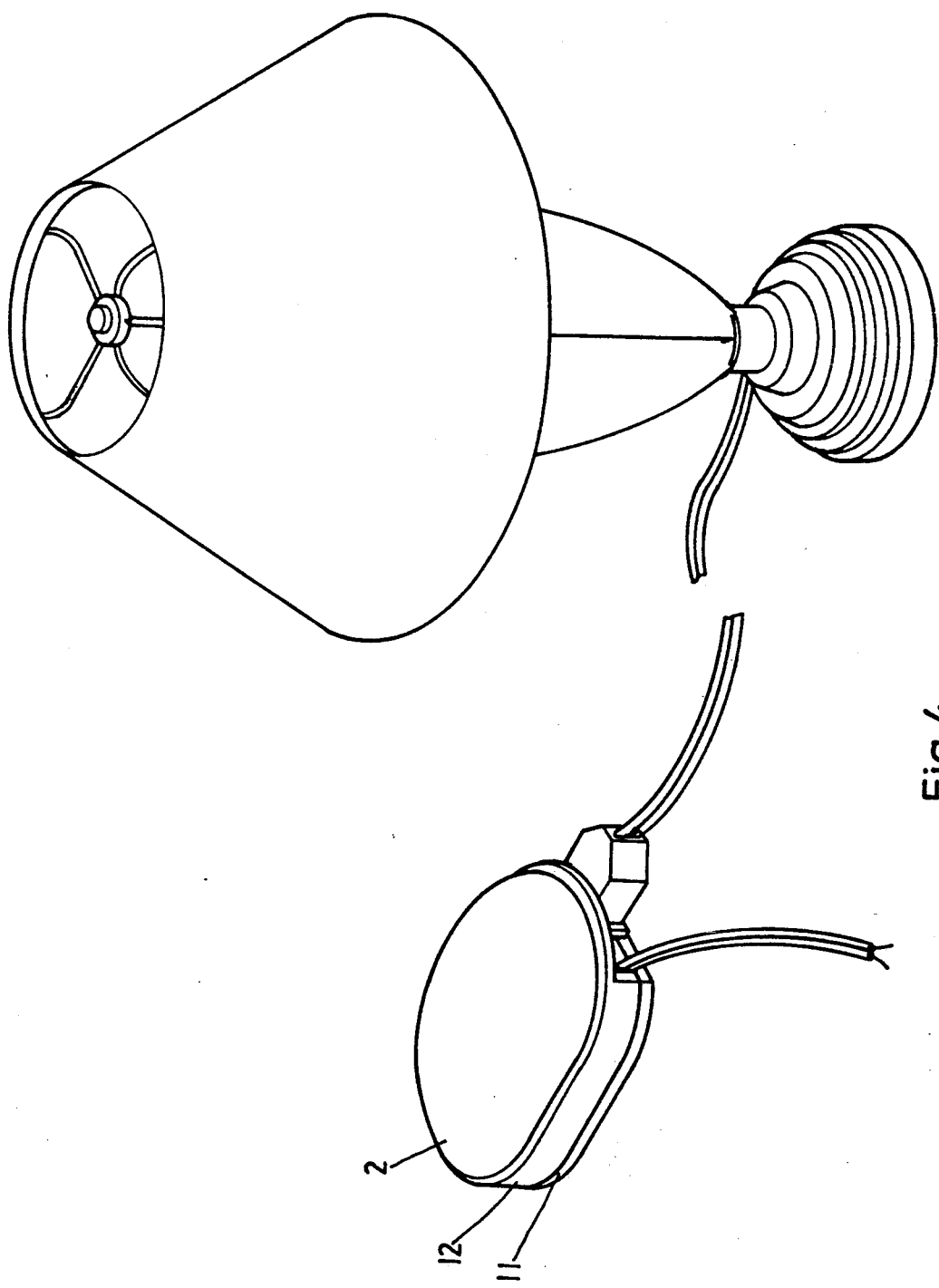
FIG. 4 illustrates the use of the present invention.

Referring to the annexed drawings in greater detail, a detachable touch-control lamp switch in accordance with the present invention is generally comprised of an outer shell 1, a touch-control metal panel 2, a control circuit board 3, and a socket 4.

The outer shell 1 is comprised of a base 11 covered with a cover 12. The base 11 has a plurality of countersink holes 112 corresponding to a plurality of bolt holes 121 made at the inside of the cover 12 for fastening a plurality of screws 111 to fixedly secure the base 11 and the cover 12 together. The cover 12 has an opening 122 at the top, a plurality of supports 123 at the inside around said opening 122 for mounting the control circuit board 3, a big notch 124 at one end for mounting the socket 4, and a small notch 125 by said big notch 124 for inserting a power cord 130. The touch-control metal panel 2 is made in shape fitting the cover 12 and adhered to the cover 12 for touch control operation. The control circuit board 3 is retained to the supports 123 inside the cover 12, having a control signal input port 131 connected with a conductor 132 which is inserted through the opening 122 and welded to the touch-control metal panel 2 and a control signal output port 133 connected with a conductor 134 to the socket 4. The socket 4 is fastened in the outer shell 1 with the plug holes thereof disposed at the big notch 124.

When in use, the ornamental lamp to be controlled is connected to the socket 4 of the detachable touch-control lamp switch of the present invention by an appliance plug. Thus, by touching the touch-control metal panel 2, the connected ornamental lamp is controlled to turn on/off or, the light intensity of the light that the connected ornamental lamp produces is changed.

What is claimed is:

1. A detachable touch-control lamp switch, comprising an outer shell, a touch-control metal panel, a control circuit board, power cord and a socket, wherein:

said outer shell is comprised of a base covered with a cover, said base having a plurality of countersink holes and said cover having a plurality of holes in registration therewith for receiving a plurality of screws to fixedly secure said base and said cover together, said cover comprising an opening at the top, a plurality of supports surrounding said opening for mounting said control circuit board, a first notch being formed at one end of said cover for mounting said socket, and a second notch on said cover spaced from said first notch for inserting a power cord, said power cord being adapted to be coupled with an external power supply to said control circuit board; said touch-control metal panel being made in the shape of said cover and being mounted on said cover outside thereof, for touch control by any part of the human body; said circuit board being retained by said supports within said cover, and having a control signal input port coupled to said touch-control metal panel through said opening in said cover, and a control signal output port coupled to said socket, said socket being adapted to be coupled to a lamp through its plug.

* * * * *